US009521449B2

(12) United States Patent
Kidron

(10) Patent No.: US 9,521,449 B2
(45) Date of Patent: Dec. 13, 2016

(54) TECHNIQUES FOR AUDIO SYNCHRONIZATION

(71) Applicant: Intel Corporation, Santa Clara, CA (US)

(72) Inventor: Amihai Kidron, Karkur (IL)

(73) Assignee: INTEL CORPORATION, Santa Clara, CA (US)

( * ) Notice: Subject to any disclaimer, the term of this patent is extended or adjusted under 35 U.S.C. 154(b) by 554 days.

(21) Appl. No.: 13/726,352

(22) Filed: Dec. 24, 2012

(65) Prior Publication Data

US 2014/0177864 A1 Jun. 26, 2014

(51) Int. Cl.
*H04B 3/00* (2006.01)
*H04N 21/43* (2011.01)
(Continued)

(52) U.S. Cl.
CPC ........ *H04N 21/4307* (2013.01); *H04N 21/242* (2013.01); *H04N 21/4305* (2013.01);
(Continued)

(58) Field of Classification Search
CPC .... H03G 3/20; H03G 3/3089; H04N 21/4307; H04N 17/004; H04N 21/2358; H04N 21/4305; H04N 5/04; H04N 21/8547
(Continued)

(56) References Cited

U.S. PATENT DOCUMENTS 5,844,600 A * 12/1998 Kerr ....................... H04N 7/147
348/14.09
6,285,405 B1 * 9/2001 Binford, Jr. ............. H04N 5/04
348/512
(Continued)

FOREIGN PATENT DOCUMENTS

JP 20120195704 10/2012
WO 02060178 8/2002
(Continued)

OTHER PUBLICATIONS

International Search Report and Written Opinion received for PCT Patent Application No. PCT/US2013/048421, mailed Oct. 24, 2013, 13 pages.
(Continued)

*Primary Examiner* — Vivian Chin
*Assistant Examiner* — Ubachukwu Odunukwe

(57) ABSTRACT

Techniques for audio synchronization are described. In one embodiment, for example, an apparatus may comprise a processor circuit and an audio synchronization module, and the audio synchronization module may be operable by the processor circuit to receive audio information comprising a first network time index defined with respect to a network clock for a network, determine a second network time index for the audio information, the second network time index defined with respect to the network clock, determine a transmission delay value for the audio information based on a difference between the first network time index and the second network time index, and determine a total delay value for the audio information based on the transmission delay value and on a remote processing delay value for the audio information. Other embodiments are described and claimed.

12 Claims, 9 Drawing Sheets

(51) Int. Cl.
*H04N 21/8547* (2011.01)
*H04N 21/242* (2011.01)
*H04N 21/4363* (2011.01)
*H04N 21/439* (2011.01)
*H04N 7/15* (2006.01)
*H03L 7/00* (2006.01)
*H04N 21/647* (2011.01)
*H04N 21/434* (2011.01)
*H04N 5/04* (2006.01)

(52) U.S. Cl.
CPC ..... *H04N 21/439* (2013.01); *H04N 21/43637* (2013.01); *H04N 21/8547* (2013.01); *H03L 7/00* (2013.01); *H04N 5/04* (2013.01); *H04N 7/152* (2013.01); *H04N 21/4344* (2013.01); *H04N 21/64723* (2013.01)

(58) Field of Classification Search
USPC ........... 381/1, 107, 80; 348/77, 207.11, 512; 709/231, 205, 244; 455/91
See application file for complete search history.

(56) References Cited

U.S. PATENT DOCUMENTS

| | | | |
|---|---|---|---|
| 7,586,544 B2 | 9/2009 | Han et al. | |
| 7,899,193 B2* | 3/2011 | Bekiares | H04N 21/41415 381/77 |
| 8,346,171 B1* | 1/2013 | Mack | H04W 52/0206 455/63.1 |
| 2002/0186782 A1* | 12/2002 | Staszewski | H03H 17/0283 375/295 |
| 2008/0117937 A1* | 5/2008 | Firestone | H04N 5/4401 370/503 |
| 2008/0304573 A1 | 12/2008 | Moss et al. | |
| 2011/0110358 A1* | 5/2011 | Haartsen | H04J 3/0632 370/350 |
| 2013/0201316 A1* | 8/2013 | Binder et al. | 348/77 |
| 2013/0290557 A1* | 10/2013 | Baratz | 709/231 |
| 2014/0043495 A1* | 2/2014 | Bateman et al. | 348/207.11 |

FOREIGN PATENT DOCUMENTS

| | | |
|---|---|---|
| WO | 2009052428 | 4/2009 |
| WO | WO2009144537 A1 | 12/2009 |
| WO | WO2009148751 A2 | 12/2009 |
| WO | WO2010068175 A2 | 6/2010 |

OTHER PUBLICATIONS

European Search Report, May 6, 2016, Application No. 13867729.9, Filed Date: Jun. 28, 2013, pp. 3.

* cited by examiner

TECHNIQUES FOR AUDIO SYNCHRONIZATION

BACKGROUND

In the field of audio acquisition and processing, it may be desirable to define a common temporal frame of reference for audio information exchanged by multiple devices. For example, it may be desirable to define a common temporal frame of reference in order to enable the synchronization of playback of audio information on speakers residing at multiple devices, or to enable a central device to combine audio information received from multiple remote devices in a time-synchronous fashion. In an arrangement in which multiple such devices are connected to a same network, a network clock for that network may provide a mutually understood temporal context for the multiple devices. As such, techniques for defining a common temporal frame of reference for audio information exchanged by multiple devices based on a network clock of a common network may be desirable.

DETAILED DESCRIPTION

Various embodiments may be generally directed to techniques for audio synchronization. In one embodiment, for example, an apparatus may comprise a processor circuit and an audio synchronization module, and the audio synchronization module may be operable by the processor circuit to receive audio information comprising a first network time index defined with respect to a network clock for a network, determine a second network time index for the audio information, the second network time index defined with respect to the network clock, determine a transmission delay value for the audio information based on a difference between the first network time index and the second network time index, and determine a total delay value for the audio information based on the transmission delay value and on a remote processing delay value for the audio information. Other embodiments may be described and claimed.

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Figure 1:
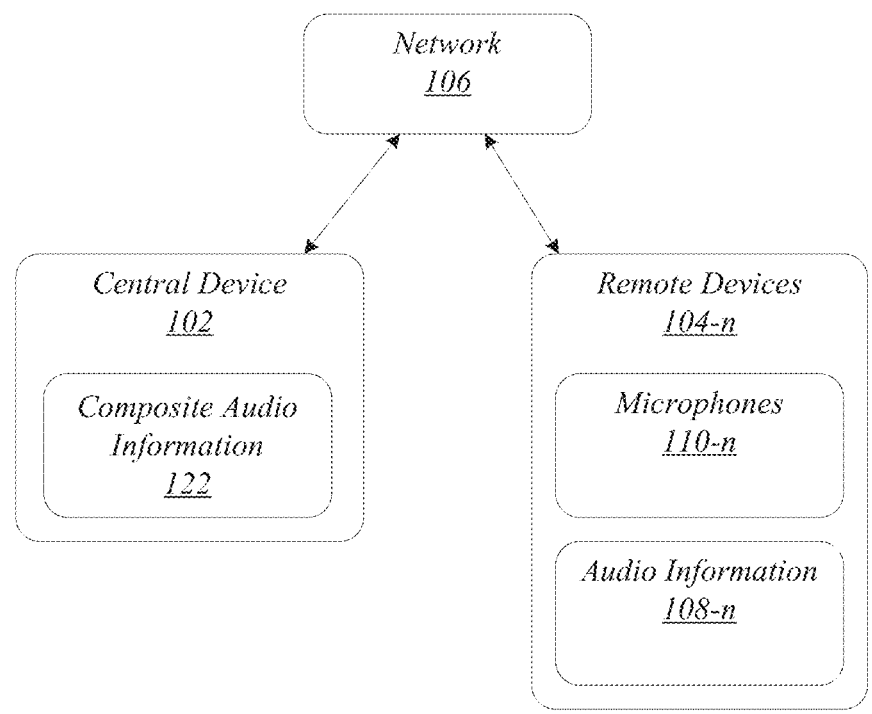
FIG. 1 illustrates one embodiment of a first operating environment.

FIG. 1 illustrates an example of an operating environment 100 according to various embodiments. As shown in FIG. 1, a central device 102 communicates with one or more remote devices 104-$n$ over a network 106. It is worthy of note that "n" and similar designators as used herein are intended to be variables representing any positive integer. Thus, for example, if an implementation sets a value for n=4, then a complete set of remote devices 104-$n$ may include remote devices 104-1, 104-2, 104-3, and 104-4. The embodiments are not limited in this context.

In some embodiments, each remote device 104-$n$ may be operative to generate respective audio information 108-$n$. In various embodiments, one or more of the remote devices 104-$n$ may comprise or be communicatively coupled to respective microphones 110-$n$, and may be operative to capture audio information 108-$n$ using those microphones 110-$n$. In some embodiments, each remote device 104-$n$ may be operative to generate its respective audio information 108-$n$ by recording audio effects associated with a same real-world event, series of events, or process. For example, in various embodiments, each remote device 104-$n$ may comprise a device in a conference room, and may capture speech of participants in a conference in that conference room. The embodiments are not limited to this example.

In some embodiments, remote devices 104-$n$ may be operative to transmit audio information 108-$n$ to central device 102 over network 106. In various embodiments, network 106 may comprise a wireless network, a wired network, or a combination of both. In some such embodiments, audio information 108-$n$ for one or more of the remote devices 104-$n$ may comprise and/or be transmitted over network 106 as an audio stream. The embodiments are not limited in this context.

In various embodiments, it may be desirable for central device 102 to define an inter-device temporal frame of reference for the audio information 108-$n$ generated by remote devices 104-$n$, such that any particular time expressed according to the inter-device temporal frame of reference will be universally understood by central device 102 and remote devices 104-$n$ to refer to a same real-world time. In some embodiments, such an inter-device temporal frame of reference may be used to synchronize playback of particular audio information 108-$n$ at multiple devices, to combine audio information received from multiple remote devices 104-$n$ in a time-synchronous fashion, and/or to perform other operations on audio information 108-$n$. The embodiments are not limited in this context.

In various embodiments, for example, it may be desirable for central device 102 to use an inter-device temporal frame of reference to combine audio information 108-$n$ received from multiple remote devices 104-$n$ to obtain composite audio information 122. In some embodiments, combining audio information from multiple sources may allow the generation of composite audio information 122 having enhanced, improved, and/or desired characteristics relative to the audio information generated by any of the multiple sources individually. For example, if a remote device 104-1 is situated at a significant distance from a speaker in a conference, it may generate audio information 108-1 that poorly captures his speech, while a remote device 104-2 situated near the speaker may generate audio information 104-2 that captures his speech well. In such an example, the audio information 108-1 might be improved by combining it with the audio information 108-2 to obtain composite audio information 122, in which the speaker's speech is well captured. The embodiments are not limited to this example.

In various embodiments, combining audio information generated by multiple sources to obtain composite audio information 122 may comprise, for each portion of audio information 108-$n$ generated by a particular remote device 104-$n$ among the multiple sources, combining that portion with corresponding portions of audio information generated by the other sources. With respect to the combination of audio information 108-$n$ received from multiple remote devices 104-$n$, portions of audio information 108-$n$ may be said to correspond to each other when they are captured at a same time, and thus correspond to a same audio effect within a real-world event, series of events, or process. For example, a remote device 104-1 may use its microphone 110-1 to generate audio information 108-1 by recording a conference, and a person participating in the conference may cough. A portion of the audio information 108-1 corresponding to the cough may be said to correspond to a portion of audio information 108-2 captured at the same time—and thus also comprising the cough—by a remote device 104-2 that is also recording the conference. The embodiments are not limited to this example.

In conventional systems, a central device such as central device 102 of FIG. 1 may lack the ability to determine which portions of various audio information 108-$n$ correspond to each other, and may thus be unable to combine the audio information 108-$n$ in such a fashion that composite audio information 122 is obtained that exhibits enhanced, improved, and/or desired characteristics. For example, in a conventional system, a central device 102 receiving audio information 108-1 and audio information 108-2 from respective remote devices 104-1 and 104-2 may be unable to determine that a portion of the audio information 108-1 comprising a cough was captured at a same time as a portion of the audio information 108-2 comprising the cough. As such, composite audio information 122 generated by the central device 102 in the conventional system may exhibit degraded and/or undesired characteristics. Continuing with the above example, a cough which occurred only once in real life may occur twice in the composite audio information 122 generated by combining the audio information 108-1 and audio information 108-2 in the conventional system. As such, techniques for defining an inter-device temporal frame of reference to enable the synchronization of audio information received from and/or generated by multiple sources may be desirable.

In some embodiments, it may desirable for central device 102 to define an inter-device temporal frame of reference in order to enable the synchronization of playback of particular audio information 108-$n$ by speakers residing at multiple remote devices 104-$n$. Synchronizing the playback of particular audio information 108-$n$ by speakers residing at multiple remote devices 104-$n$ may comprise ensuring that the audio information 108-$n$ is played back simultaneously by each of the multiple speakers. However, in various embodiments, the particular audio information 108-$n$ may not be transmitted to—and/or received by—the multiple remote devices 104-$n$ simultaneously. In conventional systems, multiple remote devices 104-$n$ receiving the same audio information at different times may be unable to determine when to play back that audio information on their speakers such that the playback is synchronized with that of the speakers residing at the other remote devices 104-$n$. As such, techniques for defining an inter-device temporal frame of reference to enable the synchronization of audio playback at multiple remote devices may be desirable.

Figure 2:
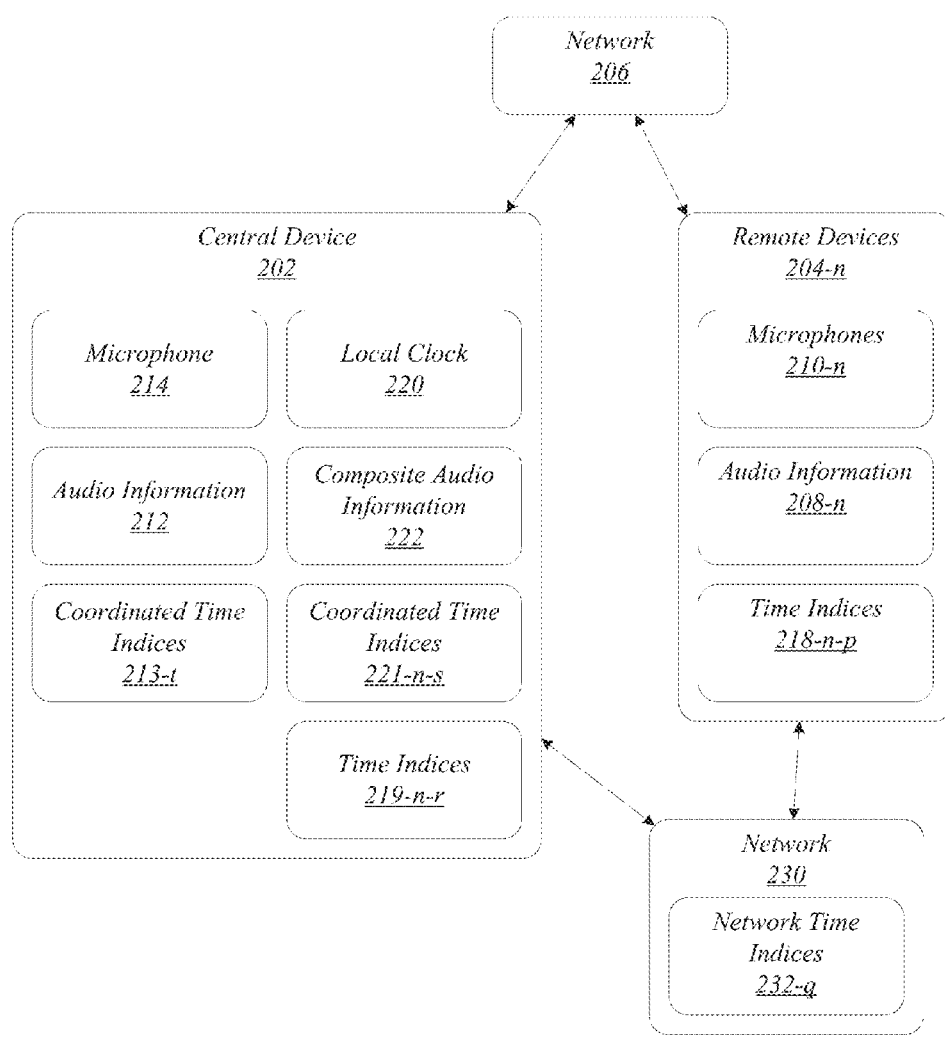
FIG. 2 illustrates one embodiment of a second operating environment.

FIG. 2 illustrates an example of an operating environment in which an inter-device temporal frame of reference may be defined for audio information 208-$n$ and/or audio information 212. As shown in FIG. 2, each remote device 204-$n$ may be operative to generate time indices 218-$n$-$p$ for its respective audio information 208-$n$. For particular audio information 208-$n$, such time indices 218-$n$-$p$ may indicate, for any particular portion of that audio information 208-$n$, a time at which that particular portion reached a defined point in an audio capture, processing, and/or transmission process. That time may be defined according to the inter-device temporal frame of reference, which may be common to and mutually understood and utilized by remote devices 204-$n$ and the central device 202. For example, time indices 218-$n$-$p$ may indicate, for any particular portion of audio information 208-$n$, a time—according to the inter-device temporal frame of reference—that that portion of audio information 208-$n$ became ready for transmission from its corresponding remote device 204-$n$ to central device 202. The embodiments are not limited to this example.

In various embodiments, remote devices 204-$n$ and central device 202 may each be connected to a network 230, and an inter-device temporal frame of reference may be defined according to network time indices 232-$q$ for the network 230. In some embodiments, the network time indices 232-$q$ for network 230 may comprise clock signals for network 230. In various embodiments, network 230 may comprise a Bluetooth® network, and network time indices 232-$q$ may comprise Bluetooth® network clock signals. In some embodiments, remote devices 204-$n$ may be operative to periodically receive network time indices 232-$q$ for network 230, and may define time indices 218-$n$-$p$ based on the network time indices 232-$q$ for network 230. The embodiments are not limited in this context.

In some embodiments, a granularity of the clock signal for network 230 may be large enough that if an inter-device temporal frame of reference is defined such that each of time indices 218-$n$-$p$ is exactly equal to a respective network time index 232-$q$, the quality of synchronization performed according to the inter-device temporal frame of reference may be lower than a desired level. For example, in various embodiments, network 230 may comprise a Bluetooth network with a 312.5 µs network clock, and synchronization performed according to an inter-device temporal frame of reference featuring such a level of granularity may yield sub-optimal results. In some embodiments, in order to reduce the granularity of the inter-device temporal frame of reference, time indices 218-$n$-$p$ may be expressed as relative offsets of network time indices 232-$q$. In some embodiments, such relative offsets may comprise numbers of periods of a symbol clock for the network 230. In an example embodiment in which network 230 comprises a Bluetooth network, time indices 218-$n$-$p$ may be expressed as relative offsets of the Bluetooth network clock, and the relative offsets may comprise numbers of periods of the Bluetooth symbol clock. For example, the Bluetooth network may comprise a network clock with a 312.5 µs period and a symbol clock with a 1 µs period, and each relative offset may comprise a number indicating a multiple of the 1 µs period of the symbol clock. As such, the granularity of the inter-device temporal frame of reference in such an example embodiment may be reduced from 312.5 µs to 1 µs. The embodiments are not limited to this example.

In various embodiments, central device 202 may also be operative to periodically receive the network time indices 232-q for network 230 that are received by remote devices 204-n, and thus may understand the inter-device temporal frame of reference utilized by remote devices 204-n based on those network time indices 232-q. For example, in some embodiments in which network 230 comprises a Bluetooth network and network time indices 232-q comprise Bluetooth network clock signals, central device 202 and remote devices 204-n may be operative to periodically receive the same Bluetooth network clock signals, remote devices 204-n may be operative to generate time indices 218-n-p based on the Bluetooth network clock signals, and central device 202 may be operative to interpret the time indices 218-n-p based on the network clock signals. The embodiments are not limited to this example.

In various embodiments, central device 202 may be operative to receive audio information 208-n and/or time indices 218-n-p from one or more remote devices 204-n over a network 206. In some embodiments, network 206 may comprise a wireless network, a wired network, or a combination of both. In various embodiments, network 206 may comprise a different network than network 230. As such, in some embodiments, an inter-device temporal frame of reference may be defined for central device 202 and one or more remote devices 204-n based on network time indices for one network, but the remote devices 204-n may transmit audio information and/or time indices to central device 202 over a second, different network. In fact, in various embodiments, central device 202 and remote devices 204-n may not communicate with each other over network 230 at all, but rather may merely use network 230 to define the inter-device temporal frame of reference, and may communicate with each other over network 206. In other embodiments, central device 202 and remote devices 204-n may communicate with each other over both network 206 and network 230. In yet other embodiments, operating environment 200 may not comprise a network 206, and central device 202 and remote devices 204-n may both define the inter-device temporal frame of reference based on network 230 and communicate over network 230. For example, in some embodiments in which network 230 comprises a Bluetooth network, central device 202 and remote devices 204-n may be operative to define the inter-device temporal frame of reference based on the Bluetooth network clock and also to communicate with each other over the Bluetooth network, while in various other embodiments, central device 202 and remote devices 204-n may be operative to define the inter-device temporal frame of reference based on the Bluetooth network clock but to communicate with each other over a different network 206. The embodiments are not limited in this context.

In some embodiments, after receipt of any particular audio information 208-n, central device 202 may be operative to generate time indices 219-n-p for that audio information. Such time indices 219-n-p may indicate, for any particular portion of that audio information 208-n, a time—according to the inter-device temporal frame of reference—at which that particular portion reached a second defined point in the audio capture, processing, and/or transmission process. For example, time indices 219-n-p may indicate, for any particular portion of audio information 208-n, a time—according to the inter-device temporal frame of reference—that that portion of audio information 208-n was received from its corresponding remote device 204-n over network 230. As such, in various embodiments, central device 202 may be operative to receive time indices 218-n-p indicating a time that a portion of audio information 208-n reached a first defined point in an audio capture, processing, and/or transmission process, and may be operative to generate time indices 219-n-p indicating a time that the portion of audio information 208-n reached a second defined point in the audio capture, processing, and/or transmission process. The embodiments are not limited in this context.

In various embodiments, central device 202 may be operative to determine a transmission delay value for the audio information 208-n based on the received time indices 218-n-p and on the generated time indices 219-n-r. In an example embodiment, a time index 218-n-p may indicate a time—according to the inter-device temporal frame of reference—that a particular portion of audio information 208-n became ready for transmission at a remote device 204-n and a time index 219-n-r may indicate a time—according to the inter-device temporal frame of reference—that the particular portion of audio information 208-n was received at central device 202, and central device 202 may be operative to determine a transmission delay value for the particular portion of audio information 208-n by subtracting the time index 218-n-p from the time index 219-n-r. In various embodiments, central device 202 may be operative to determine a total delay value for the audio information 208-n based on the transmission delay value and on a remote processing delay value for the audio information 208-n. In some embodiments, the remote processing delay value may indicate a duration of processing of the audio information 208-n prior to the generation of time index 218-n-p at its respective remote device 204-n. The embodiments are not limited in this context.

In some embodiments, central device 202 may be operative to define a local temporal frame of reference, which may comprise a temporal frame of reference internal to and understood within central device 202. In various embodiments, central device 202 may define the local temporal frame of reference based on a local clock 220. Local clock 220 may comprise a clock, oscillator, or other timing device internal to central device 202 that drives operations of one or more elements within central device 202. In some embodiments, for example, local clock 220 may comprise a clock for a processor circuit within central device 202. The embodiments are not limited in this context.

In various embodiments, central device 202 may be operative to determine coordinated time indices 221-n-s for received audio information 208-n. In some embodiments, coordinated time indices 221-n-s may be defined according to the local temporal frame of reference. In various such embodiments, coordinated time indices 221-n-s may comprise local times defined according to the local clock 220. In some embodiments, for any particular portion of audio information 208-n, a coordinated time index 221-n-s may indicate a time—according to the local temporal frame of reference—that that portion of audio information 208-n was captured. In various embodiments, for any particular audio information 208-n, central device 202 may be operative to generate coordinated time indices 221-n-s based on the total delay value for the audio information 208-n and on the local clock 220. The embodiments are not limited in this context.

In some embodiments, central device 202 may be operative to receive audio information 208-n from multiple remote devices 204-n, and may be operative to generate composite audio information 222 by combining the received audio information 208-n. In various embodiments, central device 202 may be operative to generate coordinated time indices 221-n-s for the audio information 208-n, and may be operative to combine the received audio information 208-n based on the coordinated time indices 221-n-s for that audio information 208-n. In some embodiments, central device 202 may be operative to utilize coordinated time indices 221-n-s to determine portions of audio information 208-n that were captured substantially simultaneously by different remote devices 204-n, and thus may be able to generate composite audio information 222 in which those portions of audio information 208-n are temporally aligned. Such composite audio information 222 may exhibit enhanced, improved, and/or desired characteristics relative to the audio information 208-n generated by any of the multiple remote devices 204-n individually. The embodiments are not limited in this context.

In various embodiments, central device 202 may be operative to generate its own audio information 212 corresponding to the same real-world event, series of events, or process as audio information 208-n. For example, in an embodiment in which each remote device 204-n comprises a device in a conference room and captures speech of participants in a conference in that conference room, central device 202 may be operative to generate audio information 212 by capturing speech of participants in that conference. In some embodiments, central device 102 may comprise or be communicatively coupled to a microphone 214, and may be operative to capture audio information 212 using that microphone 214. The embodiments are not limited in this context.

In various embodiments, central device 202 may be operative to determine coordinated time indices 213-t for audio information 212. In some embodiments, coordinated time indices 213-t may be defined according to the same local temporal frame of reference as coordinated time indices 221-n-s. In various such embodiments, coordinated time indices 213-t may comprise local times defined according to the local clock 220. In some embodiments, for any particular portion of audio information 212, a coordinated time index 213-t may indicate a time—according to the local temporal frame of reference—that that portion of audio information 212 was captured. In various embodiments, central device 202 may be operative to generate coordinated time indices 213-t directly, based on local clock 220, without generating time indices for audio information 212 that are based on the inter-device temporal frame of reference. In some embodiments, central device 202 may be operative to generate time indices for audio information 212 based on the inter-device temporal frame of reference, and may then be operative to generate coordinated time indices 213-t for audio information 212 based on those time indices and on a processing delay value for the audio information 212. The embodiments are not limited in this context.

In various embodiments in which it generates audio information 212, central device 202 may be operative to receive audio information 208-n from one or more remote devices 204-n, and may be operative to generate composite audio information 222 by combining the received audio information 208-n with the generated audio information 212. In some embodiments, central device 202 may be operative to combine the received audio information 208-n with the generated audio information 212 based on the coordinated time indices 221-n-s for the received audio information 208-n and the coordinated time indices 213-t for the generated audio information 212. The embodiments are not limited in this context.

Figure 3:
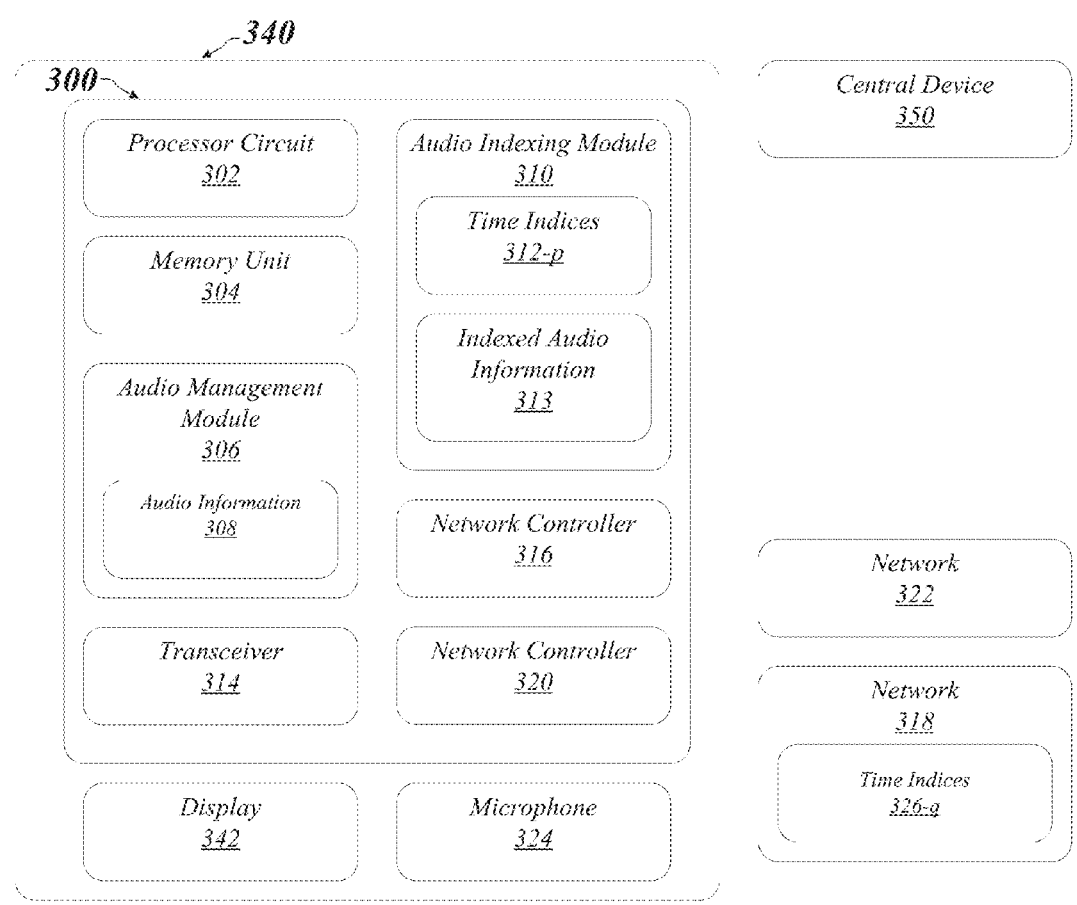
FIG. 3 illustrates one embodiment of a first apparatus and one embodiment of a first system.

FIG. 3 illustrates an apparatus 300 such as may comprise an example of a remote device 204-n of FIG. 2 according to various embodiments. As shown in FIG. 3, apparatus 300 comprises multiple elements including a processor circuit 302, a memory unit 304, an audio management module 306, an audio indexing module 310, a transceiver 314, a network controller 316, and a network controller 320. The embodiments, however, are not limited to the type, number, or arrangement of elements shown in this figure.

In various embodiments, apparatus 300 may comprise processor circuit 302. Processor circuit 302 may be implemented using any processor or logic device, such as a complex instruction set computer (CISC) microprocessor, a reduced instruction set computing (RISC) microprocessor, a very long instruction word (VLIW) microprocessor, an x86 instruction set compatible processor, a processor implementing a combination of instruction sets, a multi-core processor such as a dual-core processor or dual-core mobile processor, or any other microprocessor or central processing unit (CPU). Processor circuit 302 may also be implemented as a dedicated processor, such as a controller, a microcontroller, an embedded processor, a chip multiprocessor (CMP), a co-processor, a digital signal processor (DSP), a network processor, a media processor, an input/output (I/O) processor, a media access control (MAC) processor, a radio baseband processor, an application specific integrated circuit (ASIC), a field programmable gate array (FPGA), a programmable logic device (PLD), and so forth. In one embodiment, for example, processor circuit 302 may be implemented as a general purpose processor, such as a processor made by Intel® Corporation, Santa Clara, Calif. The embodiments are not limited in this context.

In some embodiments, apparatus 300 may comprise or be arranged to communicatively couple with a memory unit 304. Memory unit 304 may be implemented using any machine-readable or computer-readable media capable of storing data, including both volatile and non-volatile memory. For example, memory unit 304 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy of note that some portion or all of memory unit 304 may be included on the same integrated circuit as processor circuit 302, or alternatively some portion or all of memory unit 304 may be disposed on an integrated circuit or other medium, for example a hard disk drive, that is external to the integrated circuit of processor circuit 302. Although memory unit 304 is comprised within apparatus 300 in FIG. 3, memory unit 304 may be external to apparatus 300 in some embodiments. The embodiments are not limited in this context.

In some embodiments, apparatus 300 may comprise an audio management module 306. Audio management module 306 may comprise an audio subsystem for apparatus 300 in various embodiments. In some embodiments, audio management module may comprise logic, circuitry, or instructions operative to generate audio information 308. Audio information 308 may comprise information, data, logic, and/or instructions representing tones, music, speech, speech utterances, sound effects, background noise, or other sounds. The embodiments are not limited in this context.

In various embodiments, apparatus 300 may comprise an audio indexing module 310. In some embodiments, audio indexing module 310 may comprise logic, circuitry, or instructions operative to generate time indices 312 for audio information 308. In various embodiments, audio indexing module 310 may be operative to generate indexed audio information 313 based on audio information 308 and time indices 312. In some embodiments, indexing module 310 may be operative to generate indexed audio information 313 by time-stamping audio information 308 using time indices 312. The embodiments are not limited in this context.

In various embodiments, apparatus 300 may comprise a transceiver 314. Transceiver 314 may include one or more radios capable of transmitting and receiving signals using various suitable wireless communications techniques. Such techniques may involve communications across one or more wireless networks. Exemplary wireless networks include (but are not limited to) wireless local area networks (WLANs), wireless personal area networks (WPANs), wireless metropolitan area network (WMANs), cellular networks, and satellite networks. In communicating across such networks, transceiver 344 may operate in accordance with one or more applicable standards in any version. The embodiments are not limited in this context.

In some embodiments, apparatus 300 may comprise a network controller 316. In various embodiments, network controller 316 may comprise logic, circuitry, and/or instructions operative to enable communication between apparatus 300 and one or more external devices over a network 318. In some embodiments, network 318 may comprise a Bluetooth network, and network controller 316 may comprise a Bluetooth network controller. In various embodiments, network 318 may comprise a wireless network, and network controller 316 may enable communication by apparatus 300 over network 318 using transceiver 314. In some other embodiments, network 318 may comprise a wired network, and network controller 316 may enable communication by apparatus 300 over network 318 using one or more wired connections. The embodiments are not limited in this context.

In various embodiments, apparatus 300 may comprise a network controller 320. In some embodiments, network controller 320 may comprise logic, circuitry, and/or instructions operative to enable communication between apparatus 300 and one or more external devices over a network 322. In various embodiments, network 322 may comprise a wireless network, and network controller 320 may enable communication by apparatus 300 over network 322 using transceiver 314. In some other embodiments, network 322 may comprise a wired network, and network controller 320 may enable communication by apparatus 300 over network 322 using one or more wired connections. In various embodiments, apparatus 300 may comprise a single network controller that enables communications over both network 318 and network 322. The embodiments are not limited in this context.

FIG. 3 also illustrates a block diagram of a system 340. System 340 may comprise any of the aforementioned elements of apparatus 300. System 340 may further comprise a display 342. Display 342 may comprise any display device capable of displaying information received from processor circuit 302. Examples for display 342 may include a television, a monitor, a projector, and a computer screen. In one embodiment, for example, display 342 may be implemented by a liquid crystal display (LCD), light emitting diode (LED) or other type of suitable visual interface. Display 342 may comprise, for example, a touch-sensitive color display screen. In various implementations, display 342 may comprise one or more thin-film transistors (TFT) LCD including embedded transistors. In various embodiments, display 342 may be arranged to display a graphical user interface operable to directly or indirectly control one or more elements of apparatus 300. The embodiments are not limited in this respect.

In some embodiments, apparatus 300 and/or system 340 may comprise or be configurable to communicatively couple with a microphone 324. Microphone 324 may comprise any device capable of capturing ambient tones, music, speech, speech utterances, sound effects, background noise, or other sounds. In various embodiments, audio management module 306 may be operative to generate audio information 308 by capturing ambient tones, music, speech, speech utterances, sound effects, background noise, or other sounds using microphone 324. The embodiments are not limited in this context.

In general operation, apparatus 300 and/or system 340 may be operative to generate audio information 308, generate time indices 312 for the audio information 308, time-stamp the audio information 308 with the time indices 312 to obtain indexed audio information 313, and transmit the indexed audio information 313 to a central device 350 over network 322. The embodiments are not limited in this respect.

In various embodiments, audio management module 306 may be operative to generate audio information 308 corresponding to a live event. For example, in some embodiments, audio management module 306 may be operative to generate audio information 308 corresponding to a conference, a speech, a sporting event, a concert, and/or any other type of event during which ambient tones, music, speech, speech utterances, sound effects, background noise, or other sounds may occur. In various embodiments, audio management module 306 may be operative to generate audio information 308 by using microphone 324 to capture such ambient tones, music, speech, speech utterances, sound effects, background noise, or other sounds that occur during the live event. The embodiments are not limited in this context.

In some embodiments, audio indexing module 310 may be operative to generate time indices 312 for audio information 308. In various such embodiments, audio indexing module 310 may be operative to generate time indices 312 according to an inter-device temporal frame of reference. In some embodiments, such time indices 312 may indicate, for any particular portion of audio information 308, a time—according to the inter-device temporal frame of reference—at which that particular portion reached a defined point in an audio capture, processing, and/or transmission process of apparatus 300 and/or system 340. In various embodiments, an audio capture, processing, and transmission process for apparatus 300 and/or system 340 may comprise capturing audio input using microphone 324, passing the audio input to audio management module 306, generating audio information 308 at audio management module 306 based on the audio input, passing the audio information 308 to network controller 320, and transmitting the audio information 308 over network 322 using network controller 320. In an example embodiment, time indices 312 may indicate, for any particular portion of audio information 308, a time—according to the inter-device temporal frame of reference—that that portion of audio information 308 became ready for transmission to a central device 350 over network 322 using network controller 320. The embodiments are not limited to this example.

In some embodiments, such an inter-device temporal frame of reference may be defined according to time indices 326-$q$ for the network 318. In various embodiments, the time indices 326-$q$ for network 318 may comprise clock signals for network 318. In some embodiments, network 318 may comprise a Bluetooth network, and time indices 326-$q$ may comprise Bluetooth network clock signals. The embodiments are not limited to this example.

In various embodiments, audio indexing module 310 may be operative to generate time indices 312 for audio information 308 based on the time indices 326-$q$ for network 318. In some embodiments, audio indexing module 310 may be operative to generate time indices 312 that comprise relative offsets of time indices 326-$q$. In various embodiments, each time index 312 may be of the form [N, s], where N identifies a network clock signal and s identifies an offset of the network clock signal N. In some embodiments in which network 318 comprises a Bluetooth network and time indices 326-$q$ comprise Bluetooth network clock signals, audio indexing module 310 may be operative to generate time indices 312 that comprise relative offsets of Bluetooth network clock signals, expressed in terms of the Bluetooth symbol clock. In various such embodiments, audio indexing module 310 may be operative to generate time indices 312 that are expressed as a number of Bluetooth symbol clock periods that have occurred since the most recent Bluetooth network clock signal. In some embodiments, network 318 may comprise a Bluetooth network having a 312.5 μs Bluetooth network clock and a 1 μs Bluetooth symbol clock. In an example of such an embodiment, for a portion of audio information 308 comprising a sound that occurred 9 μs after a Bluetooth network clock signal $N_3$, audio indexing module 310 may be operative to generate a time index 312 of the form [$N_3$, 9], indicating that the sound occurred and was captured 9 μs after receipt of the Bluetooth network clock signal $N_3$. In various embodiments, audio indexing module 310 may be operative to generate indexed audio information 313 based on audio information 308 and time indices 312. In some embodiments, audio indexing module 310 may be operative to timestamp audio information 308 with time indices 312 in order to generate indexed audio information 313. The embodiments are not limited in this context.

In various embodiments, apparatus 300 and/or system 340 may be operative to transmit indexed audio information 313 to a central device 350. In some embodiments, apparatus 300 and/or system 340 may be operative to transmit indexed audio information 313 to central device 350 over network 322. In various such embodiments, network 322 may comprise a wireless network, and apparatus 300 and/or system 340 may be operative to transmit indexed audio information 313 to central device 350 over network 322 using transceiver 314, and/or one or more other transceivers, transmitters, and/or antennas. In some other embodiments, network 322 may comprise a wired network, and apparatus 300 and/or system 340 may be operative to transmit indexed audio information 313 to central device 350 over network 322 using one or more wired connections. The embodiments are not limited in this context.

In some embodiments, apparatus 300 and/or system 340 may be operative to receive audio information from central device 350 and/or another remote device and determine a playback time for the audio information according to the inter-device temporal frame of reference. In various such embodiments, apparatus 300 and/or system 340 may be operative to determine a time index 312-$p$ for the received audio information, determine a transmission delay value for the audio information based on the time index 312-$p$ and on a time index comprised within the audio information, determine a total delay value for the audio information based on the transmission delay value, and determine the playback time for the audio information based on the transmission delay value. In various embodiments, apparatus 300 and/or system 340 may play back the audio information at the playback time, and this playback may be synchronized with playback of the audio information by another remote device operating according to the same inter-device temporal frame of reference. The embodiments are not limited in this context.

Figure 4:
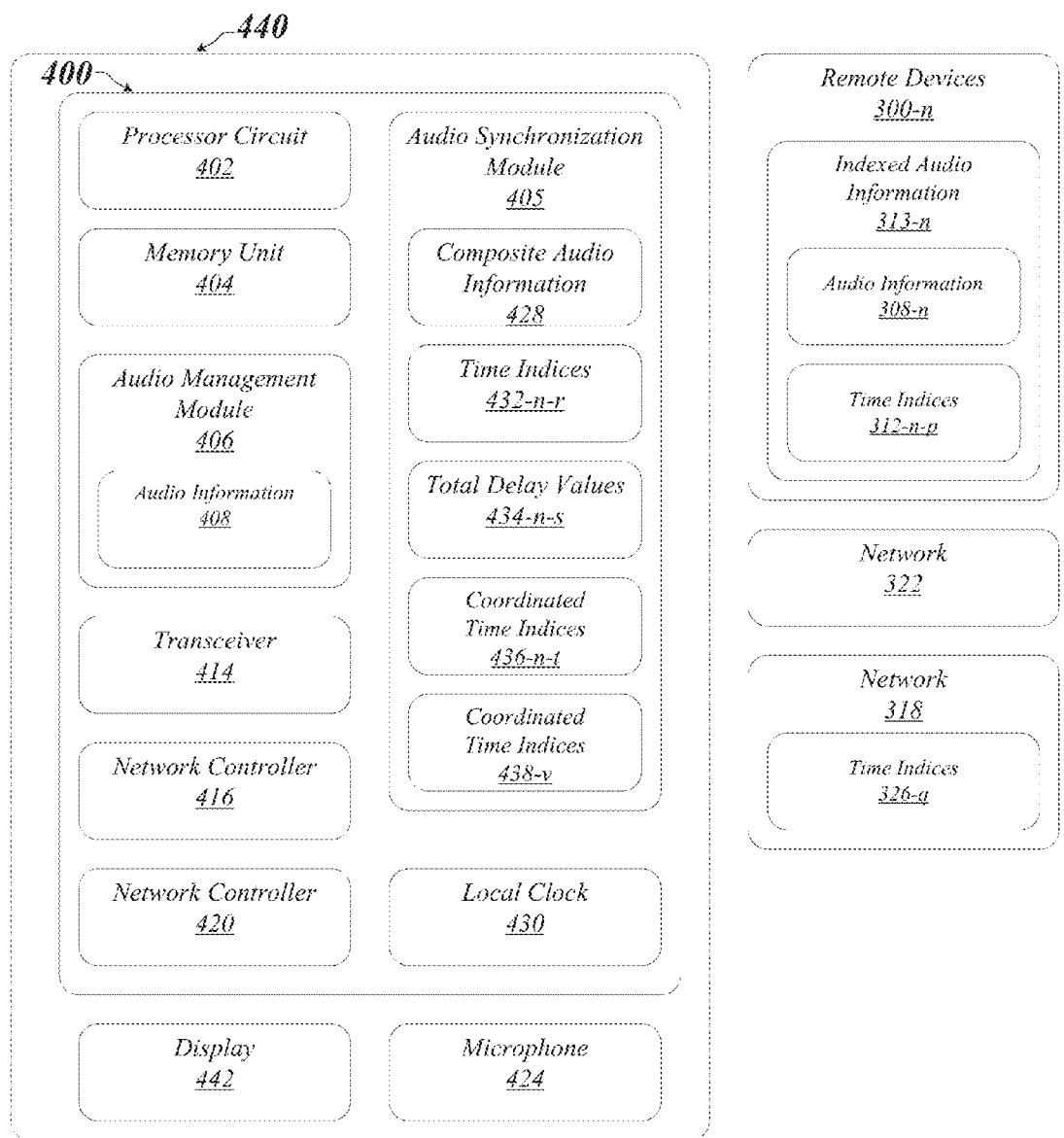
FIG. 4 illustrates one embodiment of a second apparatus and one embodiment of a second system.

FIG. 4 illustrates a central device 400 such as may comprise an example of a central device 202 of FIG. 2 according to various embodiments. As shown in FIG. 4, apparatus 400 comprises multiple elements including a processor circuit 402, a memory unit 404, an audio synchronization module 405, an audio management module 406, a transceiver 414, a network controller 416, and a network controller 420. The embodiments, however, are not limited to the type, number, or arrangement of elements shown in this figure.

In various embodiments, apparatus 400 may comprise processor circuit 402. Processor circuit 402 may be implemented using any processor or logic device, and may be the same as or similar to processor circuit 302 of FIG. 3. The embodiments are not limited in this context.

In some embodiments, apparatus 400 may comprise or be arranged to communicatively couple with a memory unit 404. Memory unit 404 may be implemented using any machine-readable or computer-readable media capable of storing data, including both volatile and non-volatile memory, and may be the same as or similar to memory unit 304 of FIG. 3. It is worthy of note that some portion or all of memory unit 304 may be included on the same integrated circuit as processor circuit 402, or alternatively some portion or all of memory unit 304 may be disposed on an integrated circuit or other medium, for example a hard disk drive, that is external to the integrated circuit of processor circuit 402. Although memory unit 404 is comprised within apparatus 400 in FIG. 4, memory unit 404 may be external to apparatus 400 in some embodiments. The embodiments are not limited in this context.

In some embodiments, apparatus 400 may comprise an audio synchronization module 405. Audio synchronization module 405 may comprise logic, circuitry, or instructions operative to synchronize and combine various audio information to obtain composite audio information 428. In various embodiments, audio synchronization module 405 may be operative to synchronize and combine audio information originating from multiple sources. The embodiments are not limited in this context.

In some embodiments, apparatus 400 may comprise an audio management module 406. Audio management module 406 may comprise an audio subsystem for apparatus 400 in various embodiments. In some embodiments, audio management module may comprise logic, circuitry, or instructions operative to generate audio information 408. Audio information 408 may comprise information, data, logic, and/or instructions representing tones, music, speech, speech utterances, sound effects, background noise, or other sounds.

In various embodiments, apparatus 400 may comprise a transceiver 414. Transceiver 414 may include one or more radios capable of transmitting and receiving signals using various suitable wireless communications techniques, and may be the same as or similar to transceiver 314 of FIG. 3.

In some embodiments, apparatus 400 may comprise a network controller 416. In various embodiments, network controller 416 may comprise logic, circuitry, and/or instructions operative to enable communication between apparatus 400 and one or more external devices over network 318 of FIG. 3. As noted above, in some embodiments, network 318 of FIG. 3 may comprise a wireless network, and thus network controller 416 may enable communication by apparatus 400 over network 318 using transceiver 414. In various other embodiments, network 318 may comprise a wired network, and network controller 416 may enable communication by apparatus 400 over network 318 using one or more wired connections. The embodiments are not limited in this context.

In some embodiments, apparatus 400 may comprise a network controller 420. In various embodiments, network controller 420 may comprise logic, circuitry, and/or instructions operative to enable communication between apparatus 400 and one or more external devices over network 322 of FIG. 3. As noted above, in some embodiments, network 322 of FIG. 3 may comprise a wireless network, and thus network controller 420 may enable communication by apparatus 400 over network 322 using transceiver 414. In various other embodiments, network 322 may comprise a wired network, and network controller 420 may enable communication by apparatus 400 over network 322 using one or more wired connections. In some embodiments, apparatus 400 may comprise a single network controller that enables communications over both network 318 and network 322. The embodiments are not limited in this context.

In various embodiments, apparatus 400 may comprise a local clock 430. In some embodiments, local clock 430 may comprise a clock, oscillator, or other timing device internal to apparatus 400 that drives operations of one or more elements within apparatus 400. In various embodiments, for example, local clock 430 may comprise a clock for processor circuit 402. The embodiments are not limited to this example.

FIG. 4 also illustrates a block diagram of a system 440. System 440 may comprise any of the aforementioned elements of apparatus 400. System 440 may further comprise a display 442. Display 442 may comprise any display device capable of displaying information received from processor circuit 402, and may be the same as or similar to display 342 of FIG. 3. In various embodiments, display 442 may be arranged to display a graphical user interface operable to directly or indirectly control one or more elements of apparatus 400. The embodiments are not limited in this respect.

In some embodiments, apparatus 400 and/or system 440 may comprise or be configurable to communicatively couple with a microphone 424. Microphone 424 may comprise any device capable of capturing ambient tones, music, speech, speech utterances, sound effects, background noise, or other sounds, and may be the same as or similar to microphone 324 of FIG. 3. In various embodiments, audio management module 406 may be operative to generate audio information 408 by capturing ambient tones, music, speech, speech utterances, sound effects, background noise, or other sounds using microphone 424. The embodiments are not limited in this context.

In general operation, apparatus 400 and/or system 440 may be operative to receive indexed audio information 313-$n$ comprising audio information 308-$n$ and time indices 312-$n$-$p$ for the audio information 308-$n$ from one or more remote devices 300-$n$, determine time indices 432-$n$-$r$ for the audio information 308-$n$ based on network time indices 326-$q$, determine total delay values 434-$n$-$s$ for the audio information 308-$n$ based on the time indices 312-$n$-$p$ and the time indices 432-$n$-$r$, determine coordinated time indices 436-$n$-$t$ for the audio information 308-$n$ based on the total delay values, and determine composite audio information 428 based on the audio information 308-$n$ and the coordinated time indices 436-$n$-$t$. In various embodiments, apparatus 400 and/or system 440 may be operative to receive audio information 308-$n$ from multiple remote devices 300-$n$ and may be operative to generate composite audio information 428 based on the audio information 308-$n$ received from the multiple remote devices 300-$n$. In some embodiments, apparatus 400 and/or system 440 may be operative to generate its own audio information 408 as well as to receive audio information 308-$n$ from one or more remote devices 300-$n$. In various such embodiments, apparatus 400 and/or system 440 may be operative to generate composite audio information 428 based on the audio information 408 that it generates and on the audio information 308-$n$ received from the one or more remote devices 300-$n$. The embodiments are not limited in this context.

In various embodiments, audio synchronization module 405 may be operative to receive indexed audio information 313-$n$ from one or more remote devices 300-$n$, such as remote device 300 of FIG. 3. In some embodiments, audio synchronization module 405 may be operative to receive indexed audio information 313-$n$ over network 322, which may comprise a same network as network 322 of FIG. 3. In various embodiments, audio synchronization module 405 may be operative to receive indexed audio information 313-$n$ over network 322 in the form of one or more audio streams. In some such embodiments, for each remote device 300-$n$ from which audio synchronization module 405 receives indexed audio information 313-$n$ over network 322, audio synchronization module 405 may receive a corresponding audio stream comprising that indexed audio information 313-$n$. In various embodiments, indexed audio information 313-$n$ received from any particular remote device 300-$n$ may comprise audio information 308-$n$ generated by that device and time indices 312-$n$-$p$ for that audio information 308-$n$. In some embodiments, the time indices 312-$n$-$p$ may indicate, for any particular portion of audio information 308-$n$, a time—according to the inter-device temporal frame of reference—at which that particular portion reached a defined point in an audio capture, processing, and/or transmission process of its corresponding remote device 300-$n$. For example, the time indices 312-$n$-$p$ may indicate, for any particular portion of audio information 308-$n$, a time—according to the inter-device temporal frame of reference—at which that particular portion became ready for transmission to apparatus 400 and/or system 440 from its corresponding remote device 300-$n$. The embodiments are not limited in this context.

In various embodiments, audio synchronization module 405 may be operative to determine time indices 432-$n$-$r$ for the received audio information 308-$n$. In some embodiments, the time indices 432-$n$-$r$ may indicate, for any particular portion of audio information 308-$n$, a time—according to the inter-device temporal frame of reference—at which that particular portion reached a second defined point in an audio capture, processing, and/or transmission process of its corresponding remote device 300-$n$. For example, the time indices 432-$n$-$r$ may indicate, for any particular portion of audio information 308-$n$, a time—according to the inter-device temporal frame of reference—at which that particular portion was received by apparatus 400 and/or system 440 from its corresponding remote device 300-$n$. In various embodiments, audio synchronization module 405 may be operative to determine time indices 432-$n$-$r$ based on network time indices 326-$q$ for network 318. In some embodiments, audio synchronization module 405 may be operative to generate time indices 432-$n$-$r$ that comprise relative offsets of time indices 326-$q$. In various embodiments, each time index 432-$n$-$r$ may be of the form [N, s], where N identifies a network clock signal and s identifies an offset of the network clock signal N. In some embodiments in which network 318 comprises a Bluetooth network and time indices 326-$q$ comprise Bluetooth network clock signals, audio synchronization module 405 may be operative to generate time indices 432-$n$-$r$ that comprise relative offsets of Bluetooth network clock signals, expressed in terms of the Bluetooth symbol clock. In various such embodiments, audio synchronization module 405 may be operative to generate time indices 432-$n$-$r$ that are expressed as a number of Bluetooth symbol clock periods that have occurred since the most recent Bluetooth network clock signal. The embodiments are not limited in this context.

In some embodiments, audio synchronization module 405 may be operative to determine transmission delay values for the received audio information 308-$n$ based on the received time indices 312-$n$-$p$ and the generated time indices 432-$n$-$r$. In various embodiments, audio synchronization module 405 may be operative to determine such transmission delay values by subtracting the time indices 312-$n$-$p$ from the generated time indices 432-$n$-$r$. In some embodiments, the transmission delay values may indicate a duration of a time period defined by the first and second defined points in the audio capture, processing, and/or transmission processes of remote devices 300-$n$. For example, if a received time index 312-$n$-$p$ indicate a time at which a particular portion of audio information 308-$n$ was ready for transmission to apparatus 400 and/or system 440 from its remote device 300-$n$, and a generated time index 432-$n$-$r$ indicates a time at which that particular portion of audio information 308-$n$ was received by apparatus 400 and/or system 440, a transmission delay value calculated by subtracting the time index 312-$n$-$p$ from the time index 432-$n$-$r$ may indicate a delay associated with transmission of the particular portion of audio information from its remote device 300-$n$ to apparatus 400 and/or system 440. The embodiments are not limited to this example.

In some embodiments, audio synchronization module 405 may be operative to determine total delay values 434-$n$-$s$ for the received audio information 308-$n$ based on the transmission delay values for that audio information 308-$n$ and on known remote processing delay values for the audio information 308-$n$. For any particular portion of audio information 308-$n$, a remote processing delay value may indicate a duration of processing of that audio information 308-$n$ prior to the generation of a time index 312-$n$-$p$ at its respective remote device 300-$n$. The embodiments are not limited in this context.

In various embodiments, audio synchronization module 405 may be operative to determine coordinated time indices 436-$n$-$t$ for the received audio information 308-$n$ based on the total delay values 434-$n$-$s$. In some embodiments, audio synchronization module 405 may be operative to determine coordinated time indices 436-$n$-$t$ according to a local temporal frame of reference defined by local clock 430. In various embodiments, coordinated time indices 436-$n$-$t$ may comprise local times defined according to the local clock 430. In some embodiments, audio synchronization module 405 may be operative to determine coordinated time indices 436-$n$-$t$ for particular audio information 308-$n$ according to the local temporal frame of reference based on the total delay values 434-$n$-$s$ for that audio information 308-$n$ and on the local clock 430. In some embodiments, audio synchronization module 405 may be operative to determine, upon receipt of any particular portion of audio information 308-$n$, a coordinated time index 436-$n$-$t$ by subtracting a total delay value 434-$n$-$s$ for that portion of audio information 308-$n$ from the current local time according to the local clock 430. In various such embodiments, the coordinated time indices 436-$n$-$t$ may indicate local times at which their corresponding portions of audio information 308-$n$ were captured, according to the local clock 430. The embodiments are not limited in this context.

In some embodiments, audio synchronization module 405 may be operative to generate composite audio information 428 based on audio information 308-$n$ and on coordinated time indices 436-$n$-$t$. In various embodiments, apparatus 400 and/or system 440 may be operative to receive audio information 308-$n$ from multiple remote devices 300-$n$, and audio synchronization module 405 be operative to generate composite audio information 428 by combining the various received audio information 308-$n$ based on corresponding coordinated time indices 436-$n$-$t$. In some embodiments, audio synchronization module 405 may be operative to utilize coordinated time indices 436-$n$-$t$ to determine portions of audio information 308-$n$ that were captured substantially simultaneously by different remote devices 300-$n$, and thus may be able to generate composite audio information 428 in which those portions of audio information 308-$n$ are temporally aligned. In various embodiments, composite audio information 428 may comprise an audio stream. The embodiments are not limited in this context.

In some embodiments, audio management module 406 may be operative to generate audio information 408. In various embodiments, audio information 408 may correspond to a same live event as that to which the indexed audio information 313-$n$ received from remote devices 300-$n$ corresponds. For example, in some embodiments, audio management module 406 may be operative to generate audio information 408 by capturing audio in a conference in which audio is also being captured by remote devices 300-$n$. In various embodiments, audio management module 406 may be operative to generate audio information 408 by using microphone 424 to capture ambient tones, music, speech, speech utterances, sound effects, background noise, or other sounds that occur during the live event. The embodiments are not limited in this context.

In some embodiments, audio synchronization module 405 may be operative to determine coordinated time indices 438-$v$ for audio information 408. In various embodiments, coordinated time indices 438-$v$ may be defined according to the same local temporal frame of reference as coordinated time indices 436-$n$-$t$. In some such embodiments, coordinated time indices 438-$v$ may comprise local times defined according to the local clock 430. In various embodiments, for any particular portion of audio information 408, a coordinated time index 438-$v$ may indicate a time—according to the local temporal frame of reference—that that portion of audio information 408 was captured. In some embodiments, audio synchronization module 405 may be operative to generate coordinated time indices 438-$v$ directly, based on local clock 430, without generating time indices for audio information 408 that are based on the inter-device temporal frame of reference. In various embodiments, audio synchronization module 405 may be operative to generate time indices for audio information 408 based on the inter-device temporal frame of reference, and may then be operative to generate coordinated time indices 438-$v$ for audio information 408 based on those time indices and on a local processing delay value indicating a delay between generation of the audio information 408 by audio management module 406 and receipt of the audio information 408 by audio synchronization module 405. The embodiments are not limited in this context.

In some embodiments, audio synchronization module 405 may be operative to generate composite audio information 428 by combining audio information 408 with audio information 308-$n$ received from one or more remote devices 300-$n$. In various embodiments, audio synchronization module 405 may be operative to generate composite audio information 428 based on audio information 408, audio information 308-$n$, coordinated time indices 436-$n$-$t$, and coordinated time indices 438-$v$. The embodiments are not limited in this context.

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality as described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited in this context.

Figure 5:
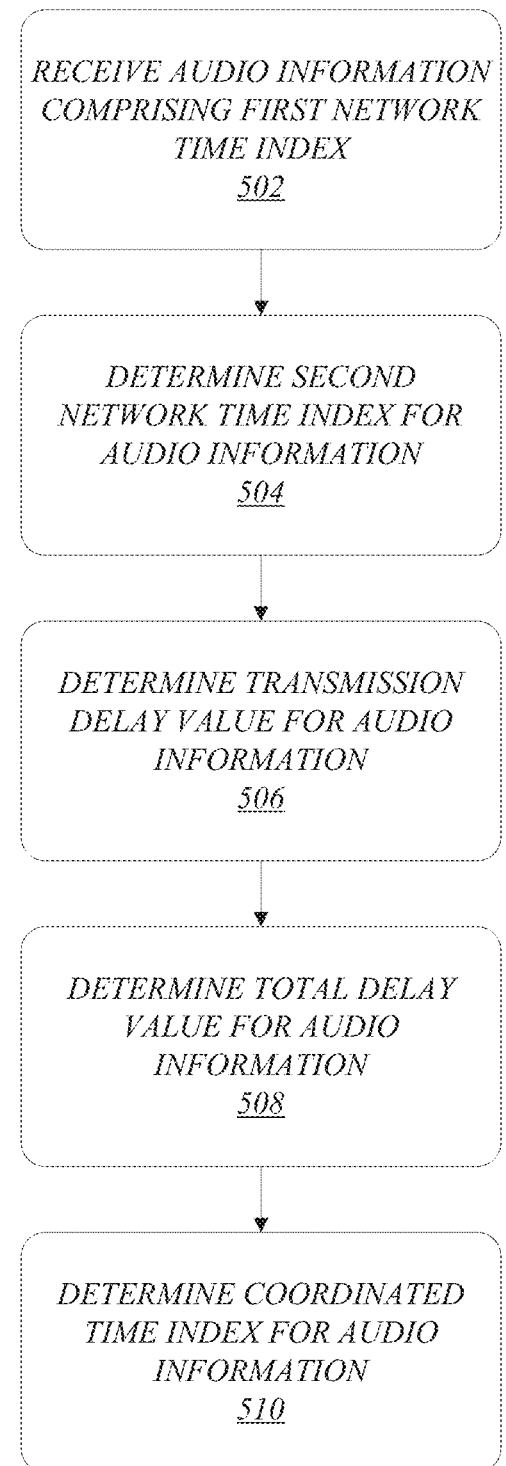
FIG. 5 illustrates one embodiment of a first logic flow.

FIG. 5 illustrates one embodiment of a logic flow 500, which may be representative of the operations executed by one or more embodiments described herein. More particularly, logic flow 500 may comprise an example of a process for generating composite audio information such as may be performed by apparatus 400 and/or system 440 of FIG. 4 in some embodiments. As shown in logic flow 500, audio information comprising a first network time index may be received at 502. For example, audio synchronization module 405 of FIG. 4 may receive indexed audio information 313-$n$ comprising audio information 308-$n$ and a time index 312-$n$-$p$. In a more particular example, the time index 312-$n$-$p$ may comprise a first timestamp applied to the audio information 308-$n$ by its remote device 300-$n$ prior to transmission of the audio information 308-$n$ to apparatus 400 and/or system 440. At 504, a second network time index may be determined for the audio information. For example, audio synchronization module 405 of FIG. 4 may determine a time index 432-$n$-$r$ for the audio information 308-$n$. In a more particular example, the time index 432-$n$-$r$ may comprise a second timestamp applied to the audio information 308-$n$ by audio synchronization module 405 upon receipt of the audio information 308-$n$.

At 506, a transmission delay value may be determined for the audio information. For example, audio synchronization module 405 of FIG. 4 may determine a transmission delay value for audio information 308-$n$ based on the time index 312-$n$-$p$ and the time index 432-$n$-$r$. In a more particular example, audio synchronization module 405 of FIG. 4 may determine the transmission delay value for audio information 308-$n$ by subtracting the first timestamp from the second timestamp. At 508, a total delay value for the audio information may be determined. For example, audio synchronization module 405 of FIG. 4 may determine a total delay value 434-$n$-$s$ for the audio information 308-$n$ based on the transmission delay value for the audio information 308-$n$ and on a remote processing delay value for the audio information 308-$n$. At 510, a coordinated time index for the audio information may be determined. For example, audio synchronization module 405 of FIG. 4 may determine a coordinated time index 436-$n$-$t$ for the audio information 308-$n$ based on the total delay value 434-$n$-$s$ for the audio information 308-$n$ and on the local clock 430. The embodiments are not limited to these examples.

Figure 6:
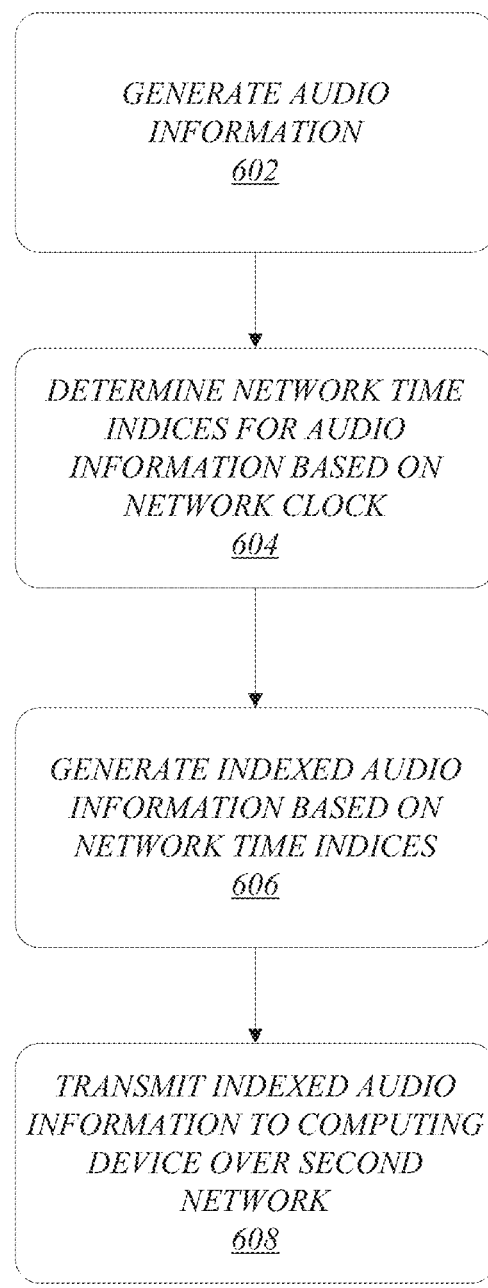
FIG. 6 illustrates one embodiment of a first logic flow.

FIG. 6 illustrates one embodiment of a logic flow 600, which may be representative of the operations executed by one or more embodiments described herein. More particularly, logic flow 600 may comprise an example of a process for generating indexed audio information such as may be performed by apparatus 300 and/or system 340 of FIG. 3 in various embodiments. As shown in logic flow 600, at 602, audio information may be received. For example, audio indexing module 310 of FIG. 3 may receive audio information 308 from audio management module 306. At 604, time indices may be determined for the audio information based on a network clock for a first network. For example, audio indexing module 310 of FIG. 3 may determine time indices 312-$p$ for audio information 308 based on time indices 326-$q$ defined by a network clock for network 318. At 606, indexed audio information may be generated based on the time indices. For example, audio indexing module 310 of FIG. 3 may generate indexed audio information 313 based on time indices 312-$p$ and audio information 308. At 608, the indexed audio information may be transmitted to a computing device over a second network. For example, apparatus 300 and/or system 340 of FIG. 3 may transmit indexed audio information to a computing device over network 322. The embodiments are not limited to these examples.

Figure 7:
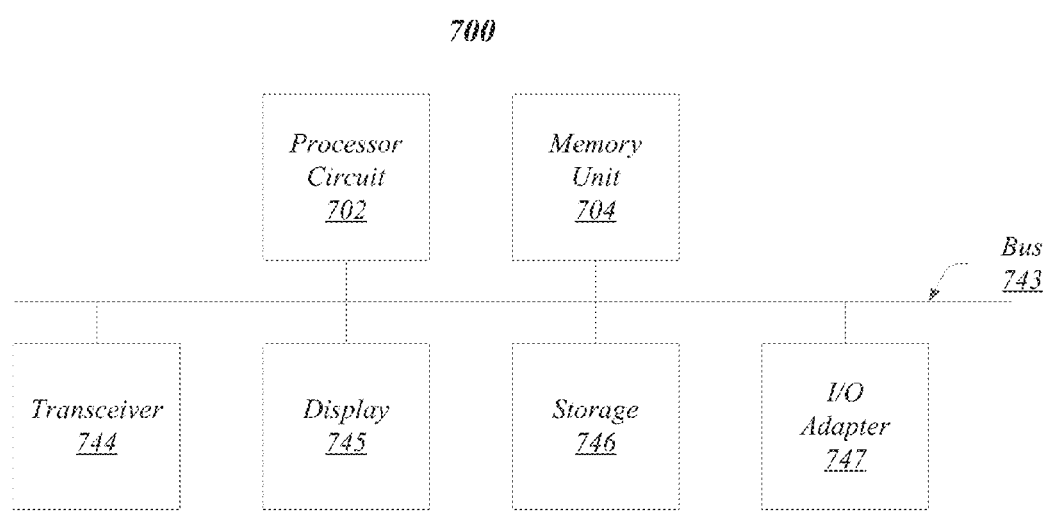
FIG. 7 illustrates one embodiment of a third system.

FIG. 7 illustrates one embodiment of a system 700. In various embodiments, system 700 may be representative of a system or architecture suitable for use with one or more embodiments described herein, such as apparatus 300 and/or system 340 of FIG. 3, apparatus 400 and/or system 440 of FIG. 4, logic flow 500 of FIG. 5, and/or logic flow 600 of FIG. 6. The embodiments are not limited in this respect.

As shown in FIG. 7, system 700 may include multiple elements. One or more elements may be implemented using one or more circuits, components, registers, processors, software subroutines, modules, or any combination thereof, as desired for a given set of design or performance constraints. Although FIG. 7 shows a limited number of elements in a certain topology by way of example, it can be appreciated that more or less elements in any suitable topology may be used in system 700 as desired for a given implementation. The embodiments are not limited in this context.

In various embodiments, system 700 may include a processor circuit 702. Processor circuit 702 may be implemented using any processor or logic device, and may be the same as or similar to processor circuit 302 of FIG. 3 and/or processor circuit 402 of FIG. 4.

In one embodiment, system 700 may include a memory unit 704 to couple to processor circuit 702. Memory unit 704 may be coupled to processor circuit 702 via communications bus 743, or by a dedicated communications bus between processor circuit 702 and memory unit 704, as desired for a given implementation. Memory unit 704 may be implemented using any machine-readable or computer-readable media capable of storing data, including both volatile and non-volatile memory, and may be the same as or similar to memory unit 304 of FIG. 3 and/or memory unit 404 of FIG. 4. In some embodiments, the machine-readable or computer-readable medium may include a non-transitory medium. The embodiments are not limited in this context.

In various embodiments, system 700 may include a transceiver 744. Transceiver 744 may include one or more radios capable of transmitting and receiving signals using various suitable wireless communications techniques, and may be the same as or similar to transceiver 314 of FIG. 3 and/or transceiver 414 of FIG. 4. The embodiments are not limited in this context.

In various embodiments, system 700 may include a display 745. Display 745 may constitute any display device capable of displaying information received from processor circuit 702, and may be the same as or similar to display 342 of FIG. 3 and/or display 442 of FIG. 4.

In various embodiments, system 700 may include storage 746. Storage 746 may be implemented as a non-volatile storage device such as, but not limited to, a magnetic disk drive, optical disk drive, tape drive, an internal storage device, an attached storage device, flash memory, battery backed-up SDRAM (synchronous DRAM), and/or a network accessible storage device. In embodiments, storage 746 may include technology to increase the storage performance enhanced protection for valuable digital media when multiple hard drives are included, for example. Further examples of storage 746 may include a hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of DVD devices, a tape device, a cassette device, or the like. The embodiments are not limited in this context.

In various embodiments, system 700 may include one or more I/O adapters 747. Examples of I/O adapters 747 may include Universal Serial Bus (USB) ports/adapters, IEEE 1394 Firewire ports/adapters, and so forth. The embodiments are not limited in this context.

Figure 8:
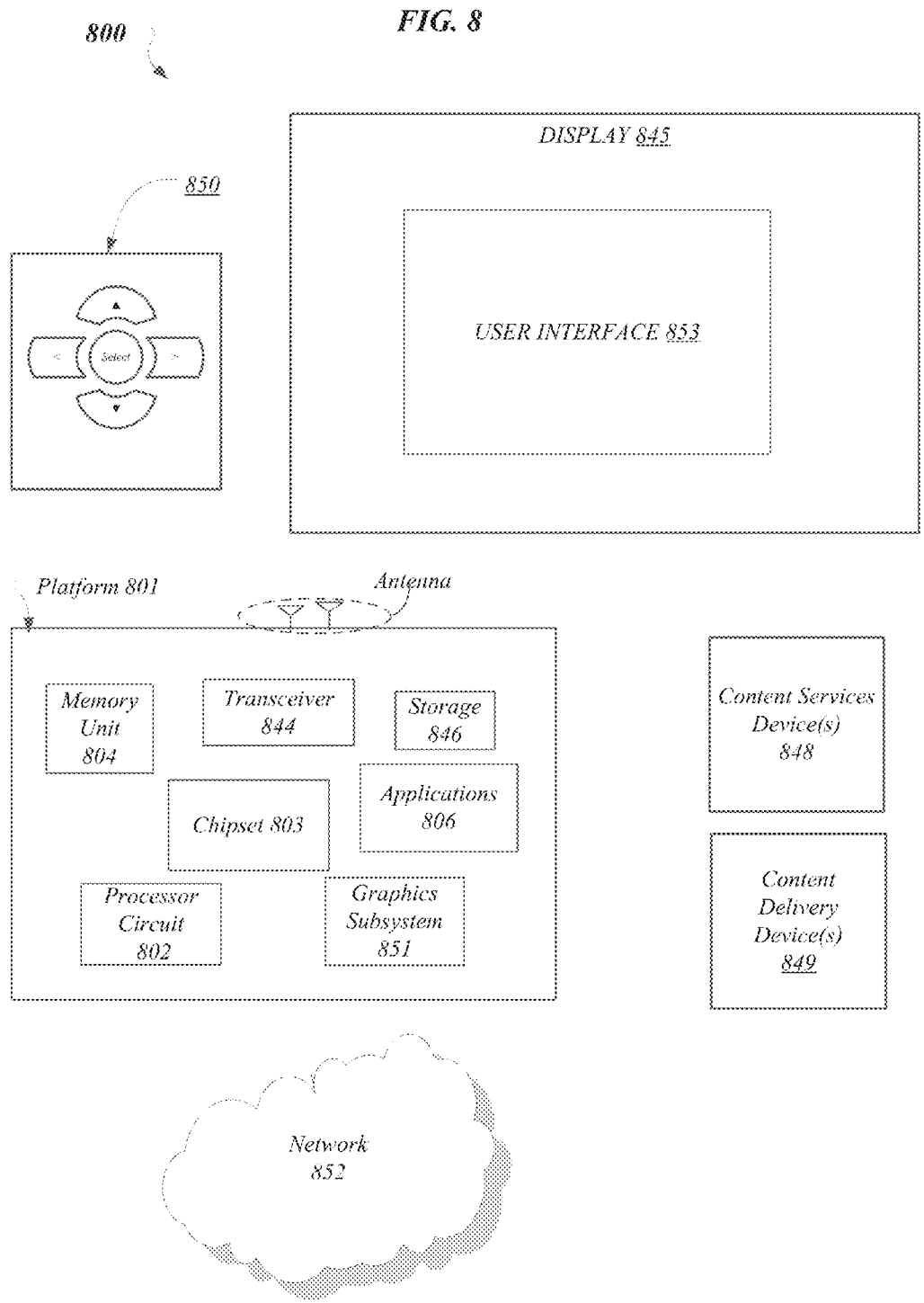
FIG. 8 illustrates one embodiment of a fourth system.

FIG. 8 illustrates an embodiment of a system 800. In various embodiments, system 800 may be representative of a system or architecture suitable for use with one or more embodiments described herein, such as apparatus 300 and/or system 340 of FIG. 3, apparatus 400 and/or system 440 of FIG. 4, logic flow 500 of FIG. 5, logic flow 600 of FIG. 6, and/or system 700 of FIG. 7. The embodiments are not limited in this respect.

As shown in FIG. 8, system 800 may include multiple elements. One or more elements may be implemented using one or more circuits, components, registers, processors, software subroutines, modules, or any combination thereof, as desired for a given set of design or performance constraints. Although FIG. 8 shows a limited number of elements in a certain topology by way of example, it can be appreciated that more or less elements in any suitable topology may be used in system 800 as desired for a given implementation. The embodiments are not limited in this context.

In embodiments, system 800 may be a media system although system 800 is not limited to this context. For example, system 800 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 800 includes a platform 801 coupled to a display 845. Platform 801 may receive content from a content device such as content services device(s) 848 or content delivery device(s) 849 or other similar content sources. A navigation controller 850 including one or more navigation features may be used to interact with, for example, platform 801 and/or display 845. Each of these components is described in more detail below.

In embodiments, platform 801 may include any combination of a processor circuit 802, chipset 803, memory unit 804, transceiver 844, storage 846, applications 806, and/or graphics subsystem 851. Chipset 803 may provide intercommunication among processor circuit 802, memory unit 804, transceiver 844, storage 846, applications 806, and/or graphics subsystem 851. For example, chipset 803 may include a storage adapter (not depicted) capable of providing intercommunication with storage 846.

Processor circuit 802 may be implemented using any processor or logic device, and may be the same as or similar to processor circuit 702 in FIG. 7.

Memory unit 804 may be implemented using any machine-readable or computer-readable media capable of storing data, and may be the same as or similar to memory unit 704 in FIG. 7.

Transceiver 844 may include one or more radios capable of transmitting and receiving signals using various suitable wireless communications techniques, and may be the same as or similar to transceiver 744 in FIG. 7.

Display 845 may include any television type monitor or display, and may be the same as or similar to display 745 in FIG. 7.

Storage 846 may be implemented as a non-volatile storage device, and may be the same as or similar to storage 746 in FIG. 7.

Graphics subsystem 851 may perform processing of images such as still or video for display. Graphics subsystem 851 may be a graphics processing unit (GPU) or a visual processing unit (VPU), for example. An analog or digital interface may be used to communicatively couple graphics subsystem 851 and display 845. For example, the interface may be any of a High-Definition Multimedia Interface, DisplayPort, wireless HDMI, and/or wireless HD compliant techniques. Graphics subsystem 851 could be integrated into processor circuit 802 or chipset 803. Graphics subsystem 851 could be a stand-alone card communicatively coupled to chipset 803.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

In embodiments, content services device(s) 848 may be hosted by any national, international and/or independent service and thus accessible to platform 801 via the Internet, for example. Content services device(s) 848 may be coupled to platform 801 and/or to display 845. Platform 801 and/or content services device(s) 848 may be coupled to a network 852 to communicate (e.g., send and/or receive) media information to and from network 852. Content delivery device(s) 849 also may be coupled to platform 801 and/or to display 845.

In embodiments, content services device(s) 848 may include a cable television box, personal computer, network, telephone, Internet enabled devices or appliance capable of delivering digital information and/or content, and any other similar device capable of unidirectionally or bidirectionally communicating content between content providers and platform 801 and/display 845, via network 852 or directly. It will be appreciated that the content may be communicated unidirectionally and/or bidirectionally to and from any one of the components in system 800 and a content provider via network 852. Examples of content may include any media information including, for example, video, music, medical and gaming information, and so forth.

Content services device(s) 848 receives content such as cable television programming including media information, digital information, and/or other content. Examples of content providers may include any cable or satellite television or radio or Internet content providers. The provided examples are not meant to limit embodiments of the invention.

In embodiments, platform 801 may receive control signals from navigation controller 850 having one or more navigation features. The navigation features of navigation controller 850 may be used to interact with a user interface 853, for example. In embodiments, navigation controller 850 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of navigation controller 850 may be echoed on a display (e.g., display 845) by movements of a pointer, cursor, focus ring, or other visual indicators displayed on the display. For example, under the control of software applications 806, the navigation features located on navigation controller 850 may be mapped to virtual navigation features displayed on user interface 853. In embodiments, navigation controller 850 may not be a separate component but integrated into platform 801 and/or display 845. Embodiments, however, are not limited to the elements or in the context shown or described herein.

In embodiments, drivers (not shown) may include technology to enable users to instantly turn on and off platform 801 like a television with the touch of a button after initial boot-up, when enabled, for example. Program logic may allow platform 801 to stream content to media adaptors or other content services device(s) 848 or content delivery device(s) 849 when the platform is turned "off." In addition, chip set 803 may include hardware and/or software support for 5.1 surround sound audio and/or high definition 7.1 surround sound audio, for example. Drivers may include a graphics driver for integrated graphics platforms. In embodiments, the graphics driver may include a peripheral component interconnect (PCI) Express graphics card.

In various embodiments, any one or more of the components shown in system 800 may be integrated. For example, platform 801 and content services device(s) 848 may be integrated, or platform 801 and content delivery device(s) 849 may be integrated, or platform 801, content services device(s) 848, and content delivery device(s) 849 may be integrated, for example. In various embodiments, platform 801 and display 845 may be an integrated unit. Display 845 and content service device(s) 848 may be integrated, or display 845 and content delivery device(s) 849 may be integrated, for example. These examples are not meant to limit the invention.

In various embodiments, system 800 may be implemented as a wireless system, a wired system, or a combination of both. When implemented as a wireless system, system 800 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 800 may include components and interfaces suitable for communicating over wired communications media, such as I/O adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 801 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 8.

Figure 9:
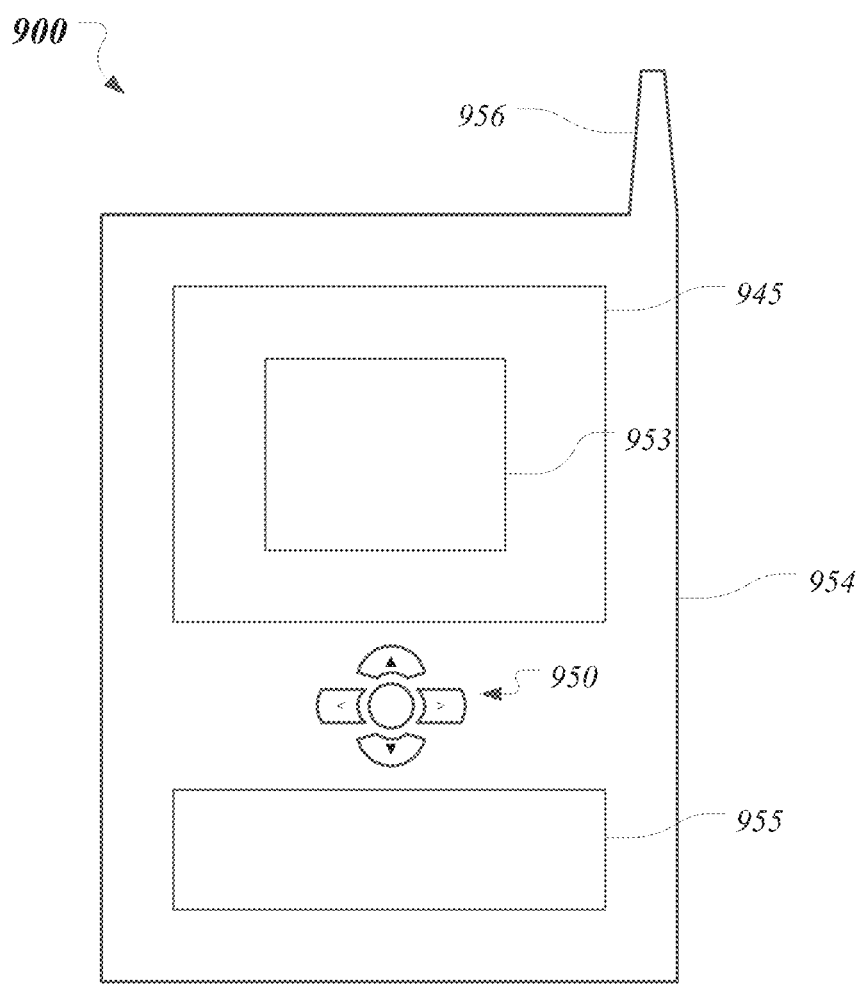
FIG. 9 illustrates one embodiment of a device.

As described above, system 800 may be embodied in varying physical styles or form factors. FIG. 9 illustrates embodiments of a small form factor device 900 in which system 800 may be embodied. In embodiments, for example, device 900 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 9, device 900 may include a display 945, a navigation controller 950, a user interface 953, a housing 954, an I/O device 955, and an antenna 956. Display 945 may include any suitable display unit for displaying information appropriate for a mobile computing device, and may be the same as or similar to display 845 in FIG. 8.

Navigation controller 950 may include one or more navigation features which may be used to interact with user interface 953, and may be the same as or similar to navigation controller 850 in FIG. 8. I/O device 955 may include any suitable I/O device for entering information into a mobile computing device. Examples for I/O device 955 may include an alphanumeric keyboard, a numeric keypad, a touch pad, input keys, buttons, switches, rocker switches, microphones, speakers, voice recognition device and software, and so forth. Information also may be entered into device 900 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or rewriteable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments:

At least one machine-readable medium may comprise a plurality of instructions that, in response to being executed on a computing device, cause the computing device to receive audio information comprising a first network time index defined with respect to a network clock for a network, determine a second network time index for the audio information, the second network time index defined with respect to the network clock, determine a transmission delay value for the audio information based on a difference between the first network time index and the second network time index, and determine a total delay value for the audio information based on the transmission delay value and on a remote processing delay value for the audio information, the remote processing delay value indicating a duration of processing of the audio information by a remote device.

Such at least one machine-readable medium may comprise instructions that, in response to being executed on the computing device, cause the computing device to determine a coordinated time index for the audio information based on the total delay value and on a local clock, the coordinated time index indicating a time defined with respect to the local clock.

With respect to such at least one machine-readable medium, the network clock may comprise a Bluetooth network clock for a Bluetooth network.

With respect to such at least one machine-readable medium, the first network time index may indicate a relative offset of a network clock value, and the relative offset may comprise a number of periods of a symbol clock for the network.

Such at least one machine-readable medium may comprise instructions that, in response to being executed on the computing device, cause the computing device to synchronize playback of the audio information by multiple devices according to an inter-device temporal frame of reference defined based on the network clock.

Such at least one machine-readable medium may comprise instructions that, in response to being executed on the computing device, cause the computing device to receive second audio information, determine a coordinated time index for the second audio information, and combine the audio information with the second audio information based on the coordinated time index for the audio information and the coordinated time index for the second audio information.

An apparatus may comprise a processor circuit and an audio synchronization module for execution on the processor circuit to receive audio information comprising a first network time index defined with respect to a network clock for a network, determine a second network time index for the audio information, the second network time index defined with respect to the network clock, determine a transmission delay value for the audio information based on a difference between the first network time index and the second network time index, and determine a total delay value for the audio information based on the transmission delay value and on a remote processing delay value for the audio information, the remote processing delay value indicating a duration of processing of the audio information by a remote device.

With respect to such an apparatus, the audio synchronization module may be for execution on the processor circuit to determine a coordinated time index for the audio information based on the total delay value and on a local clock, and the coordinated time index may indicate a time defined with respect to the local clock.

With respect to such an apparatus, the network clock may comprise a Bluetooth network clock for a Bluetooth network.

With respect to such an apparatus, the first network time index may indicate a relative offset of a network clock value, and the relative offset comprising a number of periods of a symbol clock for the network.

With respect to such an apparatus, the audio synchronization module may be for execution on the processor circuit to synchronize playback of the audio information by multiple devices according to an inter-device temporal frame of reference defined based on the network clock.

With respect to such an apparatus, the audio synchronization module may be for execution on the processor circuit to receive second audio information, determine a coordinated time index for the second audio information, and combine the audio information with the second audio information based on the coordinated time index for the audio information and the coordinated time index for the second audio information.

A method may comprise receiving audio information comprising a first network time index defined with respect to a network clock for a network, determining a second network time index for the audio information, the second network time index defined with respect to the network clock, determining a transmission delay value for the audio information based on a difference between the first network time index and the second network time index, and determining a total delay value for the audio information based on the transmission delay value and on a remote processing delay value for the audio information, the remote processing delay value indicating a duration of processing of the audio information by a remote device.

Such a method may comprise determining a coordinated time index for the audio information based on the total delay value and on a local clock, the coordinated time index indicating a time defined with respect to the local clock.

With respect to such a method, the network clock may comprise a Bluetooth network clock for a Bluetooth network.

With respect to such a method, the first network time index may indicate a relative offset of a network clock value, and the relative offset may comprise a number of periods of a symbol clock for the network.

Such a method may comprise synchronizing playback of the audio information by multiple devices according to an inter-device temporal frame of reference defined based on the network clock.

Such a method may comprise receiving second audio information, determining a coordinated time index for the second audio information, and combining the audio information with the second audio information based on the coordinated time index for the audio information and the coordinated time index for the second audio information.

At least one machine-readable medium may comprise a plurality of instructions that, in response to being executed on a computing device, cause the computing device to generate audio information, determine network time indices for the audio information based on a network clock for a network, and generate indexed audio information based on the network time indices and the audio information.

With respect to such at least one machine-readable medium, the network may comprise a Bluetooth network, and the network clock may comprise a Bluetooth network clock of the Bluetooth network.

With respect to such at least one machine-readable medium, the network time indices may comprise relative offsets of network clock values, and the relative offsets may comprise numbers of periods of a symbol clock for the network.

Such at least one machine-readable medium may comprise instructions that, in response to being executed on the computing device, cause the computing device to transmit the indexed audio information to a second computing device over a second network.

An apparatus may comprise a processor circuit and an audio indexing module for execution on the processor circuit to generate audio information, determine network time indices for the audio information based on a network clock for a network, and generate indexed audio information based on the network time indices and the audio information.

With respect to such an apparatus, the network may comprise a Bluetooth network, and the network clock may comprise a Bluetooth network clock of the Bluetooth network.

With respect to such an apparatus, the network time indices may comprise relative offsets of network clock values, and the relative offsets may comprise numbers of periods of a symbol clock for the network.

With respect to such an apparatus, the audio indexing module may be for execution on the processor circuit to transmit the indexed audio information to a computing device over a second network.

A system may comprise a processor circuit, a microphone coupled to the processor circuit, and a memory unit coupled to the processor circuit to store an audio indexing module for execution on the processor circuit to capture audio information using the microphone, determine time indices for the audio information based on a network clock for a network, and generate indexed audio information based on the time indices and the audio information.

With respect to such a system, the network may comprise a Bluetooth network, and the network clock may comprise a Bluetooth network clock of the Bluetooth network.

With respect to such a system, the network time indices may comprise relative offsets of network clock values, and the relative offsets may comprise numbers of periods of a symbol clock for the network.

With respect to such a system, the audio indexing module may be for execution on the processor circuit to transmit the indexed audio information to a computing device over a second network.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. At least one non-transitory machine-readable medium comprising a plurality of instructions that, in response to being executed on a computing device, cause the computing device to:
   receive at least two portions of audio information over a first network, each portion of the audio information comprising a first network time index defined with respect to a network clock for a second network, the first network time index to indicate a relative offset from a value of the network clock, the relative offset comprising a number of periods of a symbol clock for the second network;
   determine a second network time index for each portion of the audio information, the second network time index defined with respect to the network clock for the second network;
   determine a transmission delay value for each portion of the audio information based on a difference between the first network time index and the second network time index, the transmission delay to indicate a delay associated with transmission of the portion of the audio information over the first network;
   determine a total delay value for each portion of the audio information based on the transmission delay value and on a remote processing delay value for each portion of the audio information, the remote processing delay value to indicate a duration of processing by a remote device for the portion of the audio information;
   determine a coordinated time index for each portion of the audio information based on the total delay value and on a local clock, the coordinated time index to indicate a time defined with respect to the local clock;
   combine the at least two portions of audio information based on the coordinated time index for each portion of the audio information to generate composite audio information; and
   send, over the first network, the composite audio information to the remote device for playback.

2. The at least one machine-readable medium of claim 1, the coordinated time index indicating a time when the portion of the audio information was captured.

3. The at least one machine-readable medium of claim 1, the network clock comprising a Bluetooth network clock for a Bluetooth network.

4. The at least one machine-readable medium of claim 1, comprising instructions that, in response to being executed on the computing device, cause the computing device to synchronize playback of the audio information by multiple devices according to an inter-device temporal frame of reference defined based on the network clock.

5. An apparatus, comprising:
   a processor circuit; and
   audio synchronization logic for execution on the processor circuit to:
      receive at least two portions of audio information over a first network, each portion of the audio information comprising a first network time index defined with respect to a network clock for a second network, the first network time index to indicate a relative offset from a value of the network clock, the relative offset comprising a number of periods of a symbol clock for the second network;

determine a second network time index for each portion of the audio information, the second network time index defined with respect to the network clock for the second network;

determine a transmission delay value for each portion of the audio information based on a difference between the first network time index and the second network time index, the transmission delay to indicate a delay associated with transmission of the portion of the audio information over the first network;

determine a total delay value for each portion of the audio information based on the transmission delay value and on a remote processing delay value for each portion of the audio information, the remote processing delay value to indicate a duration of processing by a remote device for the portion of the audio information;

determine a coordinated time index for each portion of the audio information based on the total delay value and on a local clock, the coordinated time index to indicate a time defined with respect to the local clock;

combine the at least two portions of audio information based on the coordinated time index for each portion of the audio information to generate composite audio information; and send, over the first network, the composite audio information to the remote device for playback.

6. The apparatus of claim 5, the coordinated time index indicating a time when the portion of the audio information was captured.

7. The apparatus of claim 5, the network clock comprising a Bluetooth network clock for a Bluetooth network.

8. The apparatus of claim 5, the audio synchronization logic for execution on the processor circuit to synchronize playback of the audio information by multiple devices according to an inter-device temporal frame of reference defined based on the network clock.

9. A method, comprising:

receiving at least two portions of audio information over a first network, each portion of the audio information comprising a first network time index defined with respect to a network clock for a second network, the first network time index indicating a relative offset from a value of the network clock, the relative offset comprising a number of periods of a symbol clock for the second network;

determining a second network time index for each portion of the audio information, the second network time index defined with respect to the network clock for the second network;

determining a transmission delay value for each portion of the audio information based on a difference between the first network time index and the second network time index, the transmission delay indicating a delay associated with transmission of the portion of the audio information over the first network;

determining a total delay value for each portion of the audio information based on the transmission delay value and on a remote processing delay value for each portion of the audio information, the remote processing delay value indicating a duration of processing by a remote device for the portion of the audio information;

determining a coordinated time index for each portion of the audio information based on the total delay value and on a local clock, the coordinated time index indicating a time defined with respect to the local clock;

combining the at least two portions of audio information based on the coordinated time index for each portion of the audio information to generate composite audio information; and sending, over the first network, the composite audio information to the remote device for playback.

10. The method of claim 9, the coordinated time index indicating a time when the portion of audio information was captured.

11. The method of claim 9, the network clock comprising a Bluetooth network clock for a Bluetooth network.

12. The method of claim 9, comprising synchronizing playback of the audio information by multiple devices according to an inter-device temporal frame of reference defined based on the network clock.

* * * * *